(12) United States Patent
Yamanaka et al.

(10) Patent No.: US 8,106,401 B2
(45) Date of Patent: Jan. 31, 2012

(54) DISPLAY DEVICE INCLUDING METAL LINES PROVIDED ABOVE PHOTODIODE

(75) Inventors: Masaki Yamanaka, Osaka (JP); Hiromi Katoh, Osaka (JP); Christopher Brown, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 113 days.

(21) Appl. No.: 12/595,322

(22) PCT Filed: Apr. 17, 2008

(86) PCT No.: PCT/JP2008/057479
§ 371 (c)(1),
(2), (4) Date: Oct. 9, 2009

(87) PCT Pub. No.: WO2008/133162
PCT Pub. Date: Nov. 6, 2008

(65) Prior Publication Data
US 2010/0140631 A1    Jun. 10, 2010

(30) Foreign Application Priority Data

Apr. 25, 2007  (JP) ................................. 2007-115913

(51) Int. Cl.
H01L 27/14 (2006.01)
H01L 29/04 (2006.01)
H01L 29/15 (2006.01)
H01L 31/036 (2006.01)

(52) U.S. Cl. ............... 257/72; 257/59; 257/80; 257/657

(58) Field of Classification Search ........... 257/E33.046, 257/E29.336, E31.036, E31.087, E31.061, 257/458, 656, 46, 104, 105, 106, 79, 80, 257/59, 72, 61, 570; 438/24, 135, 157
See application file for complete search history.

(56) References Cited

U.S. PATENT DOCUMENTS

| 2005/0045881 | A1 | 3/2005 | Nakamura et al. |
| 2005/0064613 | A1 | 3/2005 | Takeuchi et al. |
| 2006/0113612 | A1* | 6/2006 | Gopalakrishnan et al. ... 257/392 |
| 2008/0067587 | A1* | 3/2008 | Gossner et al. ............. 257/336 |

FOREIGN PATENT DOCUMENTS

| EP | 1 511 084 | 3/2005 |
| EP | 1 517 375 | 3/2005 |
| JP | 2-2690 | 1/1990 |
| JP | 2001-244445 | 9/2001 |

OTHER PUBLICATIONS

International Search Report for PCT/JP2008/057479, mailed Jul. 22, 2008.

* cited by examiner

*Primary Examiner* — Ha Tran T Nguyen
*Assistant Examiner* — Thanh Y Tran
(74) *Attorney, Agent, or Firm* — Nixon & Vanderhye P.C.

(57) ABSTRACT

Provided are a display device in which variation in output characteristics of the photodiode is suppressed, and a method for manufacturing the display device. The display device is provided with the active matrix substrate (2) and photodiode (6). First, on a substrate of glass (12), a silicon film (8) and an interlayer insulation film (15) for covering the silicon film (8) are formed in this order. Then, a metal film is formed, and metal lines (10, 11) traversing the silicon film (8) are formed by etching the metal film. Then, p-type impurity ions are implanted by using a mask that has an opening (24a) that exposes a portion that overlaps a region where a p-layer (9a) is to be formed, a part of the opening (24a) being formed with the metal line (10). Furthermore, n-type impurity ions are implanted by using a mask that has an opening (25b) that exposes a portion that overlaps a region where an n-layer (9c) is to be formed, a part of the opening (25a) being formed with the metal line (11).

2 Claims, 6 Drawing Sheets ly on the active matrix substrate, from the viewpoint of
DISPLAY DEVICE INCLUDING METAL LINES PROVIDED ABOVE PHOTODIODE This application is the U.S. national phase of International Application No. PCT/JP2008/057479 filed 17 Apr. 2008, which designated the U.S. and claims priority to JP 2007-115913 filed 25 Apr. 2007, the entire contents of each of which are hereby incorporated by reference.

TECHNICAL FIELD

The present invention relates to a display device provided with a photodiode, and a method for manufacturing the display device.

BACKGROUND ART

In the field of display devices typified by liquid crystal display devices, a brightness of a display screen of a display device is adjusted according to an intensity of ambient light of the display device thereinafter this light is referred to as "external light"). Therefore, to incorporate a light sensor in the display device has been proposed. The incorporation of the light sensor in the display device can be achieved by mounting a light sensor as a discrete component on a display panel thereof. Further, in the case of a liquid crystal display device, a light sensor can be formed monolithically on an active matrix substrate by utilizing a process for forming an active element (TFT) and a peripheral circuit.

In the field of display devices for mobile terminal devices in particular, the light sensor is required to be formed monolithically on the active matrix substrate, from the viewpoint of reducing the number of components and downsizing a display device. As the light sensor formed monolithically, a photodiode having a lateral structure, for example, is known (see, for example, JP 2006-3857 A).

Here, a conventional photodiode (light sensor) is described with reference to FIG. 6. FIG. 6 is a cross-sectional view showing a configuration of a conventional photodiode. As shown in FIG. 6, a photodiode 51 is a PIN diode having the lateral structure, formed monolithically on the active matrix substrate included in a liquid crystal display panel.

As shown in FIG. 6, the photodiode 51 has a silicon film 60 provided on a glass substrate 52 serving as a base substrate of an active matrix substrate 50. The silicon film 60 is formed at the same time when the thin film transistor (TFT) functioning as the active element is formed, by utilizing the step for forming the TFT. In the silicon film 60, a p-type semiconductor region (p-layer) 51$a$, an intrinsic semiconductor region (i-layer) 51$b$, and an n-type semiconductor region (n-layer) 51$c$ are provided in a plane direction in the stated order. In this photodiode 51, the i-layer 51$b$ serves as a light detection region.

Below the photodiode 51, a light blocking film 53 for blocking illumination light from a backlight device is provided, with a basecoat film 54 being interposed between the photodiode 51 and the light blocking film 53. The photodiode 51 is covered with interlayer insulation films 55 and 56.

In FIG. 6, "57" denotes a line connected with the p-layer 51$a$, "58" denotes a line connected with the n-layer 51$c$. Further, "59" denotes a flattening film, and "61" denotes a protective film. "62" denotes a liquid crystal layer. Regarding a counter substrate 63, only its outline is shown, while illustration of details thereof is omitted.

DISCLOSURE OF INVENTION

Problem to be Solved by the Invention

It should be noted that an output characteristic of the photodiode 51 shown in FIG. 6 is determined by a length L of the i-layer 51$b$ in the forward direction (i.e., the channel length). If the lengths L of the i-layers 51$b$ vary, the output characteristics of the photodiode 51 also vary. The variation in the lengths L of the i-layers 51$b$ significantly depends on the alignment precision of resist patterns serving as masks used for ion implantation, and hence, the lengths L tend to vary with PIN diodes.

Therefore, in some cases, though PIN diodes are produced to the same specifications, the products have different output characteristics. Further, in some cases, even though PIN diodes are produced to the same specifications so as to be mounted on the same active matrix substrate, the PIN diodes have different output characteristics. In such a case, it is difficult to adjust brightness of the display screen by using the light sensor. Therefore, the process for producing the photodiode 51 is required to suppress the variation in the lengths L of the i-layers 51$b$.

It is an object of the present invention to solve the above-described problem, and to provide a display device in which variation in output characteristics of photodiode is suppressed, and a method for manufacturing the display device.

Means to Solve the Problem

To achieve the above-described object, a method for manufacturing a display device according to the present invention is a method for manufacturing a display device including an active matrix substrate on which a plurality of active elements are formed, and a photodiode, wherein the photodiode includes a silicon film in which a p-type semiconductor region, an intrinsic semiconductor region, and an n-type semiconductor region are provided in a plane direction, and the method includes the steps of: (a) forming the silicon film on a base substrate of the active matrix substrate, the silicon film being to become the photodiode; (b) forming an insulation film covering the silicon film; (c) forming a metal film on the insulation film, and etching the metal film, so as to form two metal lines traversing the silicon film; (d) implanting ions of a p-type impurity by using a first mask that has a first opening that exposes a portion that overlaps a region where the p-type semiconductor region is to be formed, a part of the first opening being formed with one of the metal lines; and (e) implanting ions of an n-type impurity by using a second mask that has a second opening that exposes a portion that overlaps a region where the n-type semiconductor region is to be formed, a part of the second opening being formed with the other one of the metal lines.

To achieve the above-described object, a display device according to the present invention is a display device including an active matrix substrate on which a plurality of active elements are formed, and a photodiode, and the display device is configured so that the photodiode includes a silicon film provided on a base substrate of the active matrix substrate, in which a p-type semiconductor region, an intrinsic semiconductor region, and an n-type semiconductor region are formed in the silicon film in a plane direction in this order; two metal lines are provided above the photodiode in such a manner that the metal lines traverse the photodiode in a direction vertical to a forward direction of the photodiode; one of the two metal lines is disposed so that an end thereof coincides with a boundary between the p-type semiconductor region and the intrinsic semiconductor region, in a thickness direction of the active matrix substrate; and the other one of the two metal lines is disposed so that an end thereof coincides with a boundary between the intrinsic semiconductor region and the n-type semiconductor region, in the thickness direction of the active matrix substrate.

Effects of the Invention

As described above, in the present invention, the position of the boundary between the p-type semiconductor region (p-layer) and the n-type semiconductor region (n-layer) is determined by a metal line that traverses the silicon film and is used as a mask. The metal line is formed by etching, and the alignment precision thereof is higher than the mask formed by using a resist pattern alone. Therefore, with the manufacturing method of the present invention, as compared with the conventional case, variation in the distance between the p-layer and the n-layer, i.e., the length L of the intrinsic semiconductor region (i-layer) in the forward direction is decreased considerably, whereby variation in output characteristics of photodiode also is decreased considerably.

DESCRIPTION OF THE INVENTION

Figure 1:
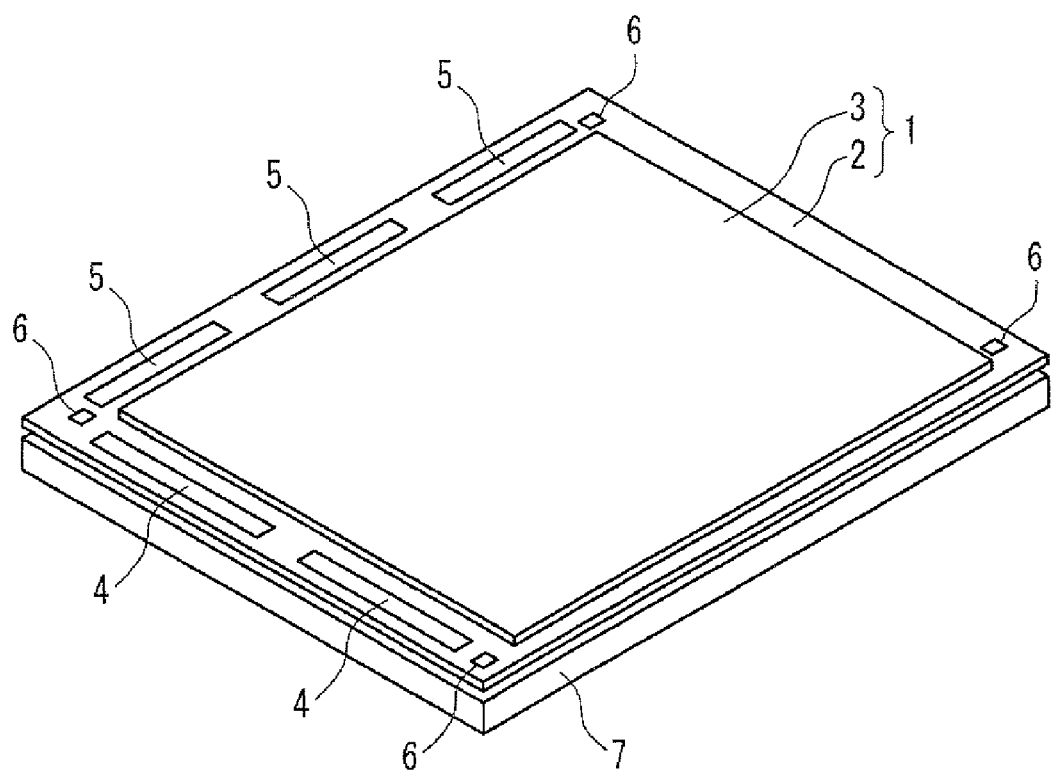
FIG. 1 is a perspective view illustrating a display device according to an embodiment of the present invention.

A method for manufacturing a display device according to the present invention is a method for manufacturing a display device including an active matrix substrate on which a plurality of active elements are formed, and a photodiode, wherein the photodiode includes a silicon film in which a p-type semiconductor region, an intrinsic semiconductor region, and an n-type semiconductor region are provided in a plane direction, and the method includes the steps of: (a) forming the silicon film on a base substrate of the active matrix substrate, the silicon film being to become the photodiode; (b) forming an insulation film covering the silicon film; (c) forming a metal film on the insulation film, and etching the metal film, so as to form two metal lines traversing the silicon film; (d) implanting ions of a p-type impurity by using a first mask that has a first opening that exposes a portion that overlaps a region where the p-type semiconductor region is to be formed, a part of the first opening being formed with one of the metal lines; and (e) implanting ions of an n-type impurity by using a second mask that has a second opening that exposes a portion that overlaps a region where the n-type semiconductor region is to be formed, a part of the second opening being formed with the other one of the metal lines.

The manufacturing method according to the present invention may further include the step of forming the intrinsic semiconductor region in the silicon film, before the step (c) is performed. Further, in the manufacturing method according to the present invention, in the step (a), the silicon film may be formed of continuous grain silicon.

Further, a display device according to the present invention is a display device that includes an active matrix substrate on which a plurality of active elements are formed, and a photodiode, and the display device is configured so that the photodiode includes a silicon film provided on a base substrate of the active matrix substrate, in which a p-type semiconductor region, an intrinsic semiconductor region, and an n-type semiconductor region are formed in the silicon film in a plane direction in this order; two metal lines are provided above the photodiode in such a manner that the metal lines traverse the photodiode in a direction vertical to a forward direction of the photodiode; one of the two metal lines is disposed so that an end thereof coincides with a boundary between the p-type semiconductor region and the intrinsic semiconductor region, in a thickness direction of the active matrix substrate; and the other one of the two metal lines is disposed so that an end thereof coincides with a boundary between the intrinsic semiconductor region and the n-type semiconductor region, in the thickness direction of the active matrix substrate.

In the display device according to the present invention, it is preferable that when an end of said one of the metal lines, on a side of the metal line opposite to a side thereof facing said other one of the metal lines, coincides with the boundary between the p-type semiconductor region and the intrinsic semiconductor region, and an end of said other one of the metal lines, on a side of the metal line opposite to a side thereof facing said one of the metal lines, coincides with the boundary between the intrinsic semiconductor region and the n-type semiconductor region, the display device further includes a driving portion for applying a voltage to the two metal lines. In this case, it is particularly preferable that the driving portion applies a negative voltage to the one of the metal lines, and a positive voltage to the other one of the metal lines. With this embodiment, positive holes can be increased immediately under one of the metal lines, while free electrons can be increased immediately under the other one of the metal lines. As a result, the depletion layer moves to a position not behind the metal lines, and the sensitivity of the photodiode is improved as compared with the case where a voltage is not applied.

EMBODIMENT

Figure 2:
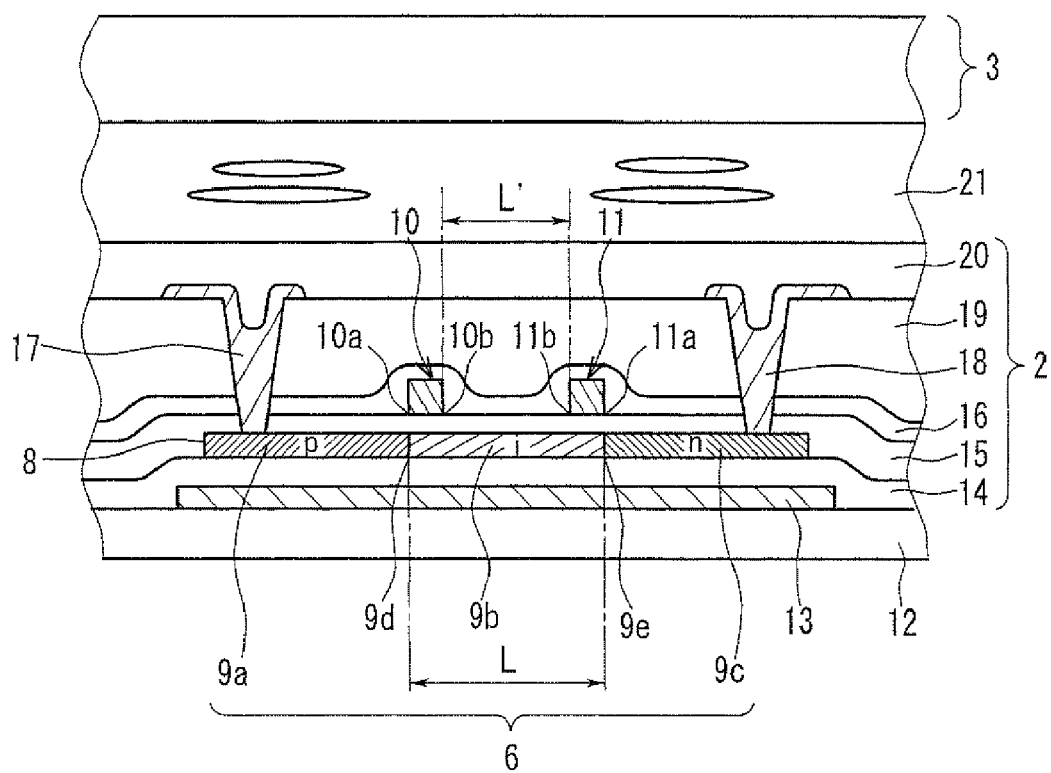
FIG. 2 is a cross-sectional view illustrating a photodiode provided in the display device according to the embodiment of the present invention.
Figure 3:
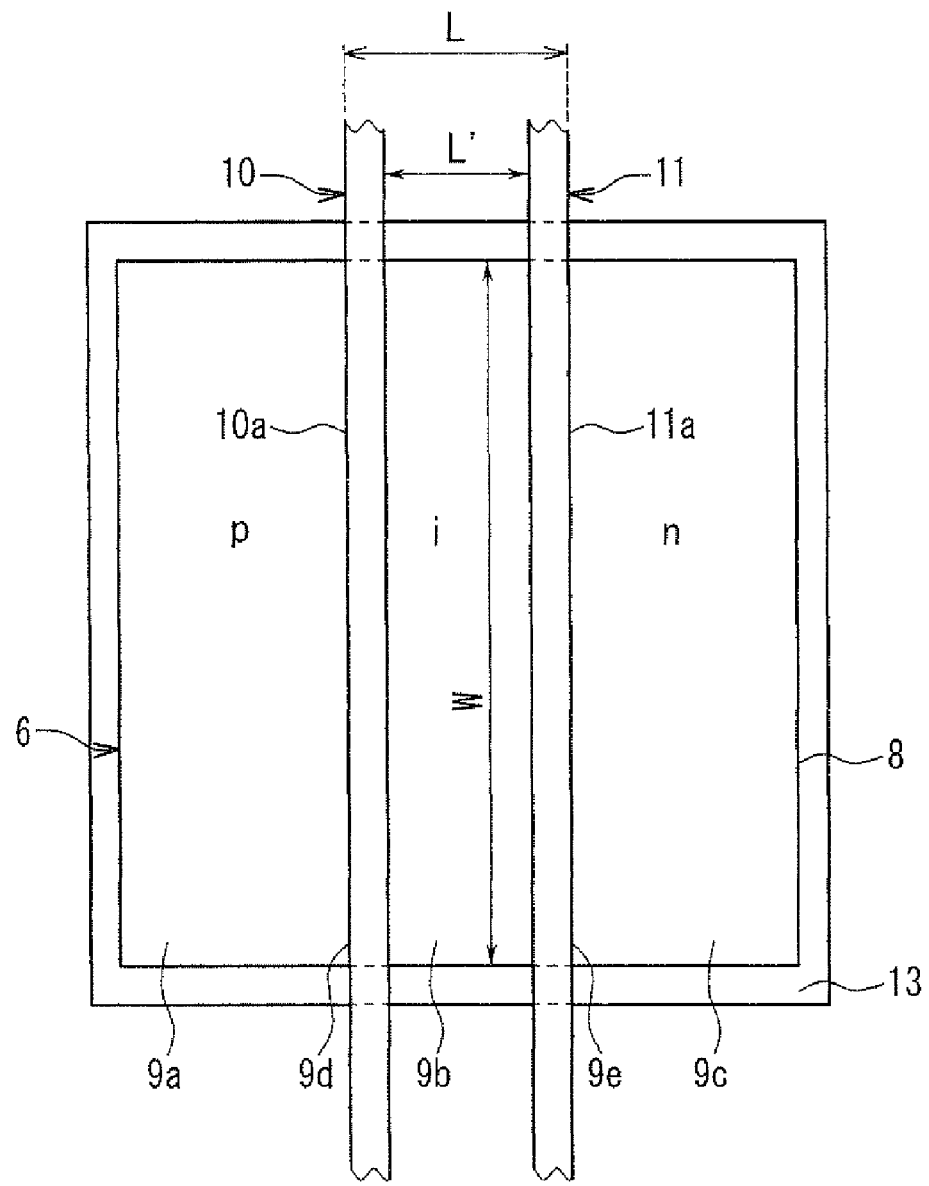
FIG. 3 is a plan view of the photodiode shown in FIG. 2.

The following describes a display device according to an embodiment of the present invention, while referring to FIGS. 1 to 3. First, an overall configuration of a display device according to the present embodiment is described with reference to FIG. 1. FIG. 1 is a perspective view illustrating a display device according to the embodiment of the present invention.

As shown in FIG. 1, the display device according to the present embodiment is a liquid crystal display device that includes a liquid crystal display panel 1, and a backlight device 7 irradiating the liquid crystal display panel 1. The display device also includes a photodiode (light sensor) 6 that reacts with external light and outputs a signal. The liquid crystal display panel 1 includes an active matrix substrate 2, a counter substrate 3, and a liquid crystal layer (not shown) interposed between these two substrates.

The active matrix substrate 2 includes a glass substrate (see FIG. 2) on which a plurality of pixels (not shown) are formed in matrix. The glass substrate is a base substrate for the active matrix substrate 2. Each of the pixels is mainly formed of a thin film transistor (TFT) that is to be an active element, and a pixel electrode formed with a transparent conductive film. A region where a plurality of pixels are arranged in matrix serves as a display region.

The counter substrate 3 is disposed so as to be superimposed on the display region of the active matrix substrate 2. The counter substrate 3 includes a counter electrode (not shown) and color filters (not shown). The color filters include, for example, coloring layers of red (R), green (G), and blue (B). The coloring layers correspond to the pixels, respectively.

The active matrix substrate 2 has a gate driver 4 and a data driver 5 in a region thereof surrounding the display region. Each active element is connected with the gate driver 4 via a gate line (not shown) extending in a horizontal direction, and is connected with the data driver 5 via a data line (not shown) extending in a vertical direction. Further, the photodiode 6 also is disposed in the region surrounding the display region of the active matrix substrate 2.

Here, a specific configuration of the photodiode 6 is described with reference to FIGS. 2 and 3. FIG. 2 is a cross-sectional view illustrating the photodiode disposed in the display device according to the embodiment of the present invention. FIG. 3 is a plan view of the photodiode shown in FIG. 2. It should be noted that only conductive bodies and semiconductors are hatched in FIG. 2.

As shown in FIG. 2, the photodiode 6, like a conventional photodiode, has a silicon film 8 provided on a glass substrate 12 as a component of the active matrix substrate 2, and is formed monolithically with the active matrix substrate 2. The silicon film 8 is formed through the same process as that for forming the silicon film forming the TFT, as will be described later.

As shown in FIGS. 2 and 3, the photodiode 6 is a PIN diode having a lateral structure. In the silicon film 8, a p-type semiconductor region (p-layer) 9a, an intrinsic semiconductor region (i-layer) 9b, and a n-type semiconductor region (n-layer) 9c are formed in a plane direction in the stated order.

In the present embodiment also, as conventionally, below the photodiode 6, a light blocking film 13 for blocking illumination light from the backlight device is provided, with a basecoat film 14 being interposed between the photodiode 6 and the light blocking film 13. Further, the photodiode 6 is covered with an interlayer insulation film 15.

Thus, the photodiode 6 has the same configuration as that of the conventional one. However, in the present embodiment, as shown in FIGS. 2 and 3, two metal lines 10 and 11 are provided above the photodiode 6 in such a manner that the metal lines 10 and 11 traverse the photodiode 6 in a direction vertical to the forward direction of the photodiode 6.

Besides, the metal line 10 is disposed so that an end 10a thereof on a side opposite to an opposed side coincides with a boundary 9d between the p-layer 9a and the i-layer 9b, in a thickness direction of the active matrix substrate 2. On the other hand, the metal line 11 is disposed so that an end 11a thereof on a side opposite to an opposed side coincides with a boundary 9e between the i-layer 9b and the n-layer 9c, in the thickness direction of the active matrix substrate 2.

It should be noted that generally in a photodiode, a so-called depletion layer in which a process of photoexcitation owing to received light occurs extends from a boundary between a p-layer and an i-layer and a boundary between an n-layer and the i-layer toward the center of the i-layer. Therefore, if the i-layer is too long in the forward direction, the depletion layer terminates at a midpoint in the i-layer, whereas if the i-layer is too short in the forward direction, the entirety of the i-layer is occupied by the depletion layer. In other words, if the i-layer is too long in the forward direction, the region where the photoexcitation occurs does not extend through the entirety of the i-layer, and the other region serves as a resistive region, whereby an output decreases. On the other hand, if the i-layer is too short in the forward direction, the region where the photoexcitation occurs is small, whereby a phototransformation efficiency decreases. It is important to form the i-layer in the photodiode in such a manner that the i-layer has an exact length in the forward direction according to the design.

In the present embodiment, in order that the i-layer 9b has a length L in the forward direction as designed and variation in products should be suppressed, the configuration is such that the metal lines 10 and 11 traversing the photodiode 6 are provided. The metal lines 10 and 11 suppress variation in positional precision of the boundaries of the i-layers 9b, and by doing so, suppress variation in output characteristics of the photodiode 6. This will be described later with references to FIGS. 4 and 5. It should be noted that the "opposed side of a metal line" in the present specification refers to a side of one metal line facing the other metal line. Besides, the "end of a metal line" refers to an edge or a face of the metal line on the opposed side or a side opposite to the opposed side.

It should be noted that the metal lines 10 and 11 block light with, respect to a part of the i-layer 9b since the metal lines 10 and 11 traverse the photodiode 6. In the i-layer 9b, regions immediately under the metal lines 10 and 11 are regions where the photoexcitation unlikely occurs. Therefore, in the present embodiment, it is preferable that a negative voltage is applied to the metal line 10 positioned closer to the p-layer 9a, while a positive voltage is applied to the metal line 11 positioned closer to the n-layer 9c.

In this case, positive holes increase in a region of the i-layer 9b immediately under the metal line 10, free electrons contrarily increase in a region of the i-layer 9b immediately under the metal line 11, and the depletion layer is formed locally at the center of the i-layer 9b. Therefore, the i-layer 9b has a substantial channel length equal to or shorter than a distance L' from an end 10b of the metal line 10 on the opposed side to an end 11b of the metal line 11 on the opposed side. In this case, as compared with the case where no voltage is applied to the metal lines 10 and 11, the region where the photoexcitation unlikely occurs becomes smaller, whereby the photodiode 6 has improved sensitivity. Thus, in the case where a voltage is applied to the metal lines 10 and 11, the length L of the i-layer 9b is set with this point being taken into consideration.

In the present embodiment, the application of voltages to the metal lines 10 and 11 can be carried out by using a driving circuit such as the gate driver 4 or the data driver 5. Alternatively, the configuration may be such that another driving circuit to be used for applying a voltage to the metal lines 10 and 11 is provided. The control of the driving circuit separately provided may be carried out also by a control device for the display device (liquid crystal controller) that supplies a control signal or a clock signal to the gate driver 4 or the data driver 5.

In FIG. 2, "16" denotes an interlayer insulation film covering the metal lines 10 and 11. "17" and "18" denote lines of the photodiode 6. "19" denotes a flattening film, and "20" denotes a protective film. "21" denotes a liquid crystal layer.

Here, a method for manufacturing the display device according to the present embodiment is described below. In the present embodiment, particularly the steps for producing the photodiode and the portions surrounding the photodiode that are included in the display device are different as compared with those in the conventional case. Further, in the present embodiment, the production of the photodiode is carried out by utilizing the steps for producing the active element (TFT) and the peripheral circuit of the same included in the active matrix substrate.

Figure 4A:
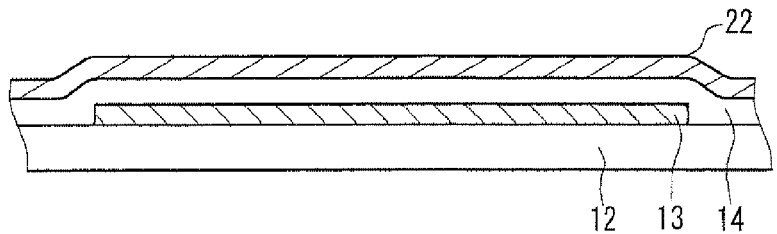
FIGS. 4A to 4D are cross-sectional views illustrating a series of principal steps of a process for producing the photodiode provided in the display device according to the embodiment of the present invention.
Figure 4B:
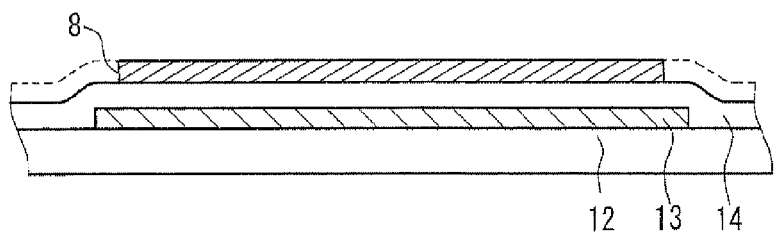
Figure 4C:
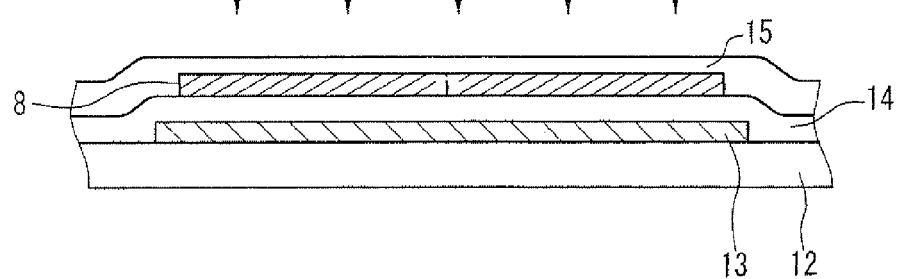
Figure 4D:
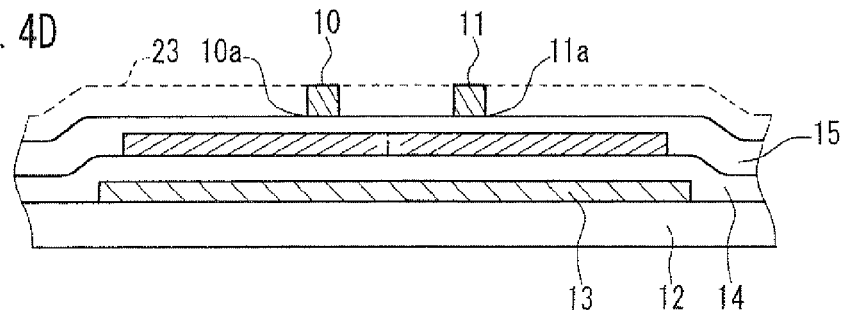
Figure 5A:
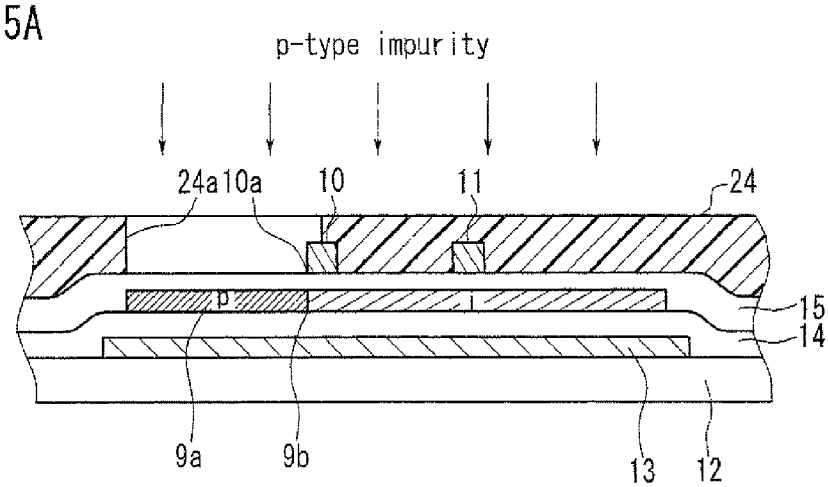
FIGS. 5A to 5C are cross-sectional views illustrating a series of principal steps of a process for producing the photodiode provided in the display device according to the embodiment of the present invention. The steps shown in FIGS. 5A to 5C are the steps carried out after the step shown in FIG. 4D.
Figure 5B:
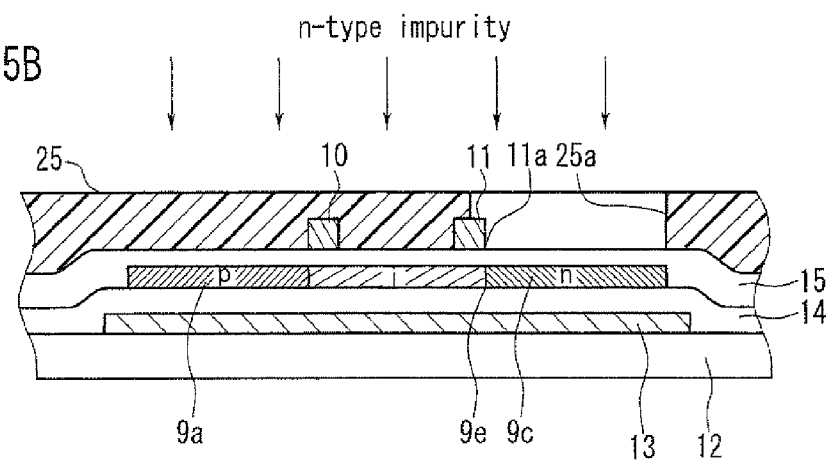
Figure 5C:
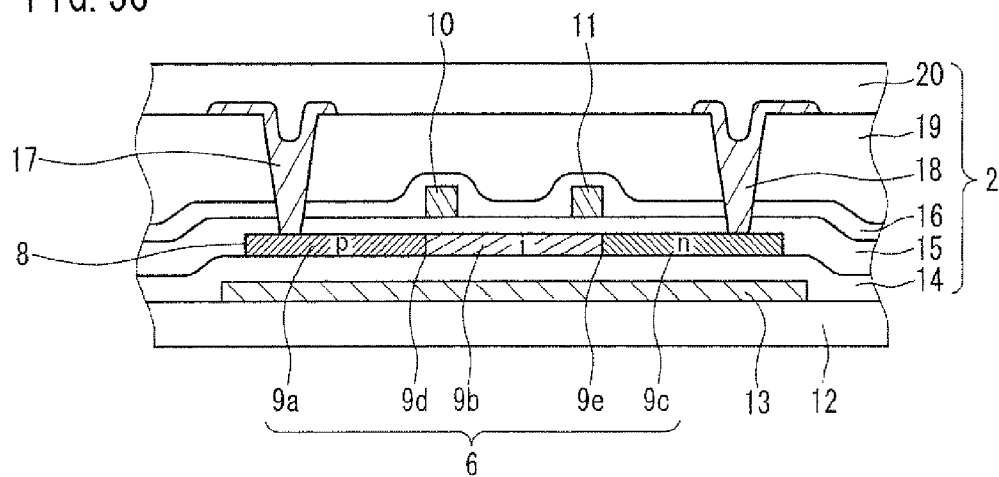

The following describes the process for producing the photodiode and the portions surrounding the photodiode, while referring to FIGS. 4 and 5. FIGS. 4 and 5 are cross-sectional views illustrating steps of a process for producing the photodiode included in the display device according to an embodiment of the present invention. FIGS. 4A to 4D illustrate a series of principal steps of the producing process. FIGS. 5A to 5C illustrate a series of principal steps of the producing process, performed after the completion of the step shown in FIG. 4D.

First, as shown in FIG. 4A, the light blocking film 13 for preventing the illumination light from the backlight device (FIG. 1) from entering the photodiode is formed on the glass substrate 12, which is to serve as the base substrate of the active matrix substrate.

More specifically, either an insulation film such as a silicon oxide film or a silicon nitride film, or a metal film containing, as a principal component, at least one of tantalum (Ta), titanium (Ti), tungsten (W), molybdenum (Mo), and aluminum (Al) is formed on one of principal faces of the glass substrate 12. Here, the film may have a film thickness of, for example, not less than 50 nm.

Subsequently, a resist pattern having an opening in a region where the light blocking film 13 is to be formed by photolithography, and either the insulation film or the metal film described above is etched using the foregoing resist pattern as a mask. As a result, the light blocking film 13 is obtained. It should be noted that the present embodiment may be modified so that the light blocking film is not formed.

Next, the basecoat film 14, which is insulative is formed to cover the light blocking film 13, and on the basecoat film 14, a silicon thin film 22 is formed, which is to become the photodiode 6 (see FIGS. 2 and 3). Specifically, for example, a silicon oxide film or a silicon nitride film can be used as the basecoat film 14, and it can be formed by the CVD method. More specifically, in the case where the silicon oxide film is formed, $SiH_4$ gas and $N_2O$ gas (or $O_2$ gas) are used as material gases. The basecoat film 14 may be a monolayer or a multilayer. The thickness of the basecoat layer 14 may be set to, for example, 100 nm to 500 nm.

Further, as the silicon thin film 22, a thin film of amorphous silicon, low-temperature polysilicon, or continuous grain silicon may be used. The silicon thin film 22 preferably is a thin film of continuous grain silicon, since electrons have high mobility therein. In this case, the silicon thin film 22 is formed in the following manner specifically.

First, the silicon oxide film and the amorphous silicon film are formed on the basecoat film 14 in the order. Next, on a top face of the amorphous silicon film, a nickel thin film to serve as a catalyst for accelerating the crystallization is formed. Subsequently, the solid-phase growth annealing is carried out so that the nickel thin film and the amorphous silicon film are caused to react with each other, whereby a crystalline silicon layer is formed along the interface therebetween. Thereafter, non-reacted portions of the nickel film and a layer of nickel silicate are removed by etching or the like. Then, the remaining silicon film is subjected to laser annealing, and with crystallization promoted, the thin film of the continuous grain silicon is completed.

In the present embodiment, the silicon thin film 22 also is used as a silicon film as a part of the TFT (not shown). Therefore, the above-described formation of the silicon thin film 22 is carried out by using the step for forming a silicon films as a part of the TFT.

Next, a resist pattern (not shown) is formed that has an opening that overlaps a region of the silicon thin film 22 where a photodiode is to be formed, and using this as a mask, etching is carried out, as shown in FIG. 4B. With this, the silicon film 8 as a part of the photodiode is obtained.

Next, as shown in FIG. 4C, an interlayer insulation film 15 covering the silicon film 8 is formed. The formation of the interlayer insulation film 15 also, like the formation of the basecoat film 14, can be carried out by forming the silicon oxide film or the silicon nitride film by the CVD method. Further, the interlayer insulation film 15 also may be a monolayer or a multilayer. The thickness of the interlayer insulation film 15 may be set to, for example, 10 nm to 120 nm. In the present embodiment, the formation of the interlayer insulation film 15 can be carried out using the step for forming a gate insulation film as a part of the TFT.

After the formation of the interlayer insulation film 15, ion implantation is carried out for forming an intrinsic semiconductor region in the silicon film 8 by adjusting a dose. Specifically, ion implantation using a p-type impurity such as boron (B) or indium (In) is carried out, since the silicon film 8 is n-type when it is formed. This makes the silicon film 8 electrically neutral.

More specifically, the ion implantation preferably is carried out so that a concentration of an impurity after the implantation is $1.5 \times 10^{20}$ [ions/cm$^3$] to $3 \times 10^{21}$ [ions/cm$^3$]. For example, the implantation energy is set to 10 [KeV] to 80 [KeV], and the dose is set to $5 \times 10^{14}$ [ions] to $2 \times 10^{16}$ [ions]. In the present embodiment, the ion implantation described above may be carried out in the following manner: an ion implantation step with the optimal conditions is selected from the ion implantation steps carried out when the TFT is formed, when the gate driver 4 (see FIG. 1) is formed, and when the data driver 5 (see FIG. 1) is formed, and the selected step is utilized.

Next, as shown in FIG. 4D, the metal lines 10 and 11 traversing the silicone film 8 is formed above the silicon film 8. Specifically, first, a metal film 23 containing, as a principal component, at least one of tantalum (Ta), titanium (Ti), tungsten (W), molybdenum (Mo), and aluminum (Al) is formed so as to cover the interlayer insulation film 15. The formation of the metal film 23 can be carried out by, for example, sputtering, vacuum deposition, or the like. Subsequently, a resist pattern having openings over regions where the metal lines 10 and 11 are to be formed is formed by photolithography, and the metal film 23 is etched using the foregoing resist pattern as a mask. With this, the metal lines 10 and 11 are obtained.

Here, in the present embodiment, the metal lines 10 and 11 are formed in such a manner that the end 10a of the metal line 10 coincides with a boundary between the p-layer 9a and the i-layer 9b to be described later, and the end 11a of the metal line 11 coincides with a boundary between the i-layer 9b and the n-layer 9c to be described later, in a thickness direction. The formation of the metal lines 10 and 11 is carried out utilizing the step for forming the gate electrodes (lines) as parts of the TFT.

Next, as shown in FIG. 5A, p-type impurity ions are implanted in the silicon film 8, whereby the p-layer 9a is formed. Specifically first, a mask is formed with the resist pattern 24, and the metal lines 10 and 11. The mask has an opening 24a to expose a portion that overlaps a region where the p-layer 9a is to be formed. Besides, a part of the opening 24a is formed with a side face of the metal line 10 on a side opposite to the opposed side.

Subsequently, ions of the p-type impurity such as boron (B) or indium (In) are implanted. In this case, the ion implantation preferably is carried out so that a concentration of an impurity after the implantation is $1.5 \times 10^{20}$ [ions/cm$^3$] to $3 \times 10^{21}$ [ions/cm$^3$]. For example, the implantation energy is set to 10 [KeV] to 80 [KeV], and the dose is set to $5 \times 10^{14}$ [ions] to $2 \times 10^{16}$ [ions]. After the ion implantation is finished, the resist pattern 24 is removed.

In the present embodiment, the ion implantation for forming the p-layer 9a also may be carried out in the following manner: an ion implantation step with the optimal conditions is selected from the ion implantation steps carried out when the gate driver 4 (see FIG. 1) is formed and when the data driver 5 (see FIG. 1) is formed, and the selected step is utilized.

Next, as shown in FIG. 5B, ions of an n-type impurity are implanted in the silicon film 8, whereby the n-layer 9c is formed. More specifically, a mask is formed with a resist pattern 25 and the metal lines 10 and 11. In this case, the mask has an opening 25a that exposes a portion that overlaps a region where the n-layer 9c is to be formed. Apart of the opening 25a is formed with a side face of the metal line 11 on a side opposite to the opposed side.

Subsequently, ion implantation is carried out using the n-type impurity such as phosphorus (P), arsenic (As), or the like. In this case, the ion implantation preferably is carried out so that a concentration of an impurity after the implantation is $1.5 \times 10^{20}$ [ions/cm$^3$] to $3 \times 10^{21}$ [ions/cm$^3$]. For example, the implantation energy is set to 10 [KeV] to 100 [KeV], and the dose is set to $5 \times 10^{14}$ [ions] to $1 \times 10^{16}$ [ions]. After the ion implantation is finished, the resist pattern 25 is removed.

In the present embodiment, the formation of the n-layer 9c is carried out by utilizing the ion implantation carried out in the step for forming a source region and a drain region of the TFT. The resist pattern also has openings that expose portions that overlap the source region and the drain region of the TFT, though these are not shown in the drawing.

Through the steps shown in FIGS. 5A and 5B, the p-layer 9a and the n-layer 9c are formed in the silicon film 8 in which the i-layer 9b has been formed. Here, an edge of the opening 24a that determines the position of the boundary between the p-layer 9a and the i-layer 9b is formed with the end 10a of the metal line 10. An edge of the opening 25a that determines the position of the boundary between the i-layer 9b and the n-layer 9c is formed with the end 11a of the metal line 11. Thus, the positional precision of the boundaries of the i-layer 9b depends on the positional precision of the end 10a of the metal line 10 and the end 11a of the metal line 11.

Figure 6:
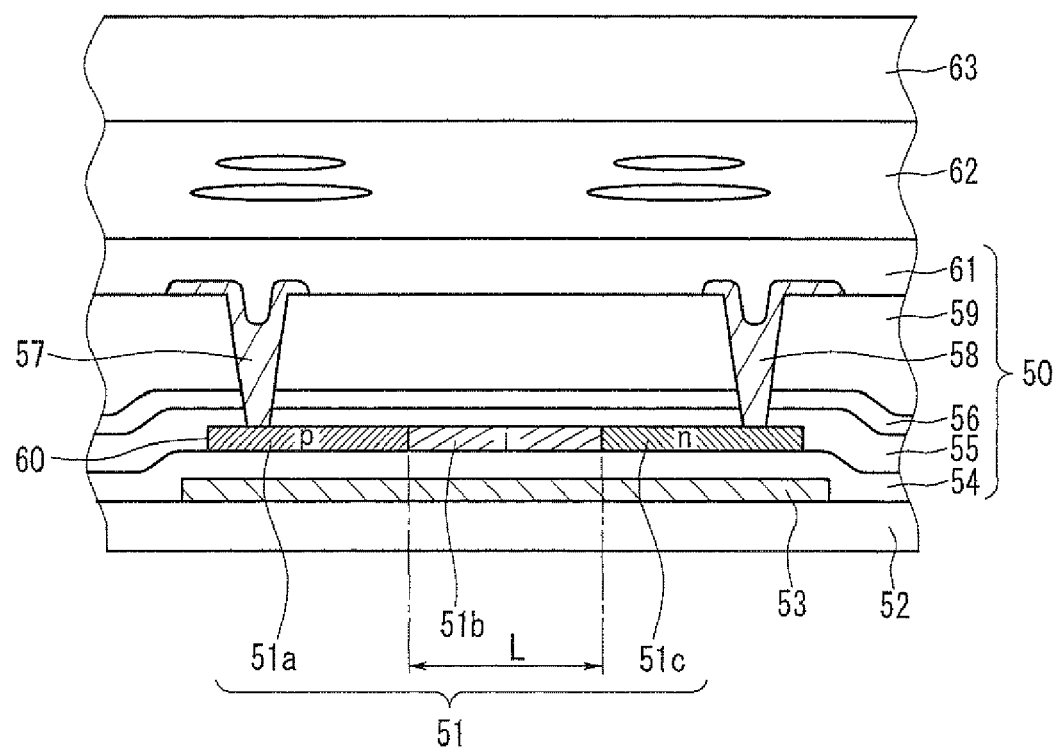
FIG. 6 is a cross-sectional view illustrating a configuration of a conventional photodiode.

It should be noted that in order to form the metal lines 10 and 11, it is necessary to form one resist pattern, as shown in FIG. 4D. Therefore, in the present embodiment, the positional precision of the boundaries of the i-layer 9b depends on an error in finished dimensions of one resist pattern. On the other hand, in the conventional example shown in FIG. 6, the positional precision of boundaries of the i-layer 51b depends on both of positional precision of the p-layer 51 and the positional precision of the n-layer 51b. Since the formation of the p-layer 51a and n-layer 51b requires the formation of a resist pattern twice, i.e., one for the formation of the p-layer 51a and the other for the formation of the n-layer 51b, the positional precision of the boundaries of the i-layer 51b depends on errors in finished dimensions of two resist patterns.

In light of these, with the present embodiment, as compared with the conventional example, the variation in lengths L in the forward direction of the i-layer 9b among products is suppressed. As a result, the variation in output characteristics of the photodiode 6 among products also is suppressed.

Next, as shown in FIG. 5, the interlayer insulation film 16 is formed so as to cover the metal lines 10 and 11. Further, the flattening film 19 is formed thereon. Subsequently, through holes going through the flattening film 19, the interlayer insulation film 16, and the interlayer insulation film 15 are formed, and are filled with a conductive material, whereby lines 17 and 18 are formed. Thereafter, the protective film 20 is formed to cover the lines 17 and 18, and the flattening film 19, whereby the active matrix substrate 2 is obtained. On the active matrix substrate 2, the counter substrate 3 (see FIG. 2) is superimposed, with the liquid crystal layer 21 (see FIG. 2) being interposed therebetween, whereby the liquid crystal display device is completed (see FIG. 1).

INDUSTRIAL APPLICABILITY

The present invention is applicable to a display device that incorporates light sensors, such as a liquid crystal display device or an electroluminescent (EL) display device, and therefore has industrial applicability.

The invention claimed is:

1. A display device comprising:
   an active matrix substrate on which a plurality of active elements are formed,
   a photodiode,
   wherein the photodiode includes a silicon film provided on a base substrate of the active matrix substrate, wherein a p-type semiconductor region, an intrinsic semiconductor region, and an n-type semiconductor region are formed sequentially in the silicon film,
   at least two metal lines are provided above the photodiode in such a manner that the metal lines traverse the photodiode in a direction vertical to a forward direction of the photodiode,
   one of the two metal lines is disposed so that an end thereof coincides with a boundary between the p-type semiconductor region and the intrinsic semiconductor region, in a thickness direction of the active matrix substrate, and
   the other one of the two metal lines is disposed so that an end thereof coincides with a boundary between the intrinsic semiconductor region and the n-type semiconductor region, in the thickness direction of the active matrix substrate.

2. The display device according to claim 1,
   wherein said end of said one of the metal lines, on a side of the metal line opposite to a side thereof facing said other one of the metal lines, coincides with the boundary between the p-type semiconductor region and the intrinsic semiconductor region,
   said end of said other one of the metal lines, on a side of the metal line opposite to a side thereof facing said one of the metal lines, coincides with the boundary between the intrinsic semiconductor region and the n-type semiconductor region,
   the display device further comprising a driving portion for applying a voltage to the two metal lines,
   wherein the driving portion applies a negative voltage to the one of the metal lines, and a positive voltage to the other one of the metal lines.

* * * * *